(12) United States Patent
Hsu et al.

(10) Patent No.: US 10,163,860 B2
(45) Date of Patent: Dec. 25, 2018

(54) SEMICONDUCTOR PACKAGE STRUCTURE

(71) Applicant: TAIWAN SEMICONDUCTOR MANUFACTURING COMPANY LTD., Hsinchu (TW)

(72) Inventors: Feng-Cheng Hsu, New Taipei (TW); Shuo-Mao Chen, New Taipei (TW); Jui-Pin Hung, Hsinchu (TW); Shin-Puu Jeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/223,356

(22) Filed: Jul. 29, 2016

(65) Prior Publication Data

US 2018/0033770 A1 Feb. 1, 2018

(51) Int. Cl.
*H01L 23/48* (2006.01)
*H01L 25/065* (2006.01)
(Continued)

(52) U.S. Cl.
CPC ...... *H01L 25/0657* (2013.01); *H01L 21/6835* (2013.01); *H01L 23/5389* (2013.01); *H01L 24/18* (2013.01); *H01L 25/03* (2013.01); *H01L 25/0652* (2013.01); *H01L 25/105* (2013.01); *H01L 25/18* (2013.01); *H01L 25/50* (2013.01); *H05K 1/0278* (2013.01); *H01L 23/3128* (2013.01); *H01L 25/0655* (2013.01); *H01L 2221/6835* (2013.01); *H01L 2221/68345* (2013.01); *H01L 2221/68359* (2013.01); *H01L 2221/68363* (2013.01); *H01L 2225/0652* (2013.01); *H01L 2225/06517* (2013.01);
(Continued)

(58) Field of Classification Search
CPC . H01L 25/0652; H01L 25/50; H01L 21/6835; H01L 25/18; H01L 23/5389; H01L 2225/0652; H01L 2225/06527; H01L 2224/48227; H01L 23/3128; H01L 25/0657; H01L 21/568; H01L 2225/1035; H01L 2224/83; H01L 25/0655
USPC ....... 257/774, 737, 777, 738, 773, 778, 690, 257/692, 723, 787
See application file for complete search history.

(56) References Cited

U.S. PATENT DOCUMENTS 8,361,842 B2 1/2013 Yu et al.
8,633,059 B2 * 1/2014 Do .......................... H01L 23/13
257/678
(Continued)

*Primary Examiner* — Shouxiang Hu
(74) *Attorney, Agent, or Firm* — WPAT, P.C., Intellectual Property Attorneys; Anthony King

(57) ABSTRACT

A semiconductor package structure includes an encapsulant, a first chip, a second chip, a first redistribution layer and a second redistribution layer. The encapsulant has a first surface and a second surface opposite to each other. The first chip is in the encapsulant, wherein the first chip includes a plurality of contact pads exposed from the first surface of the encapsulant. The second chip is in the encapsulant, wherein second chip includes a plurality of contact pads exposed from the second surface of the encapsulant. The first redistribution layer is over the first surface of the encapsulant and electrically connected to the contact pads of the first chip. The second redistribution layer is over the second surface of the encapsulant and electrically connected to the contact pads of the second chip.

20 Claims, 17 Drawing Sheets

(51) Int. Cl.
  *H01L 23/538* (2006.01)
  *H01L 25/00* (2006.01)
  *H01L 21/683* (2006.01)
  *H01L 25/18* (2006.01)
  *H01L 23/00* (2006.01)
  *H01L 25/03* (2006.01)
  *H01L 25/10* (2006.01)
  *H05K 1/02* (2006.01)
  *H01L 23/31* (2006.01)

(52) U.S. Cl.
  CPC ........... *H01L 2225/06524* (2013.01); *H01L 2225/06527* (2013.01); *H01L 2225/06548* (2013.01); *H01L 2225/06568* (2013.01); *H01L 2225/06586* (2013.01); *H01L 2225/1035* (2013.01); *H01L 2225/1058* (2013.01)

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,878,360 B2 * | 11/2014 | Meyer .............. H01L 23/49816 257/678 |
| 2007/0246806 A1 * | 10/2007 | Ong .................... H01L 23/3128 257/666 |
| 2011/0241197 A1 * | 10/2011 | Theuss ................ B81C 1/00238 257/693 |
| 2011/0291288 A1 | 12/2011 | Wu et al. |
| 2013/0037950 A1 * | 2/2013 | Yu .................... H01L 23/49816 257/738 |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0200185 A1 * | 7/2015 | Yu ........................... H01L 24/17 257/737 |
| 2016/0260684 A1 * | 9/2016 | Zhai .................... H01L 25/0652 |

\* cited by examiner

SEMICONDUCTOR PACKAGE STRUCTURE

BACKGROUND

A semiconductor package structure contains active and passive devices. Active devices including bipolar and field effect transistors, which control the flow of electrical current. Passive devices including resistors, capacitors and inductors, which create a relationship between voltage and current necessary to perform a variety of electrical functions. The passive and active devices are electrically connected to form circuits, which enable the semiconductor device to perform high-speed calculations and other useful functions.

With the evolving of semiconductor technologies, semiconductor devices are becoming increasingly smaller. In the meantime, more functions need to be integrated into the semiconductor devices. Accordingly, the semiconductor devices need to have increasingly greater numbers of I/O contact pads packed into smaller areas, and the density of the I/O contact pads rises quickly with time. As a result, the packaging of the semiconductor devices becomes more difficult, which adversely affects the yield of the packaging.

BRIEF DESCRIPTION OF THE DRAWINGS

Aspects of the present disclosure are best understood from the following detailed description when read with the accompanying figures. It is rioted that, in accordance with the standard practice in the industry, various structures are not drawn to scale. In fact, the dimensions of the various structures may be arbitrarily increased or reduced for clarity of discussion.

DETAILED DESCRIPTION

Figure 1:
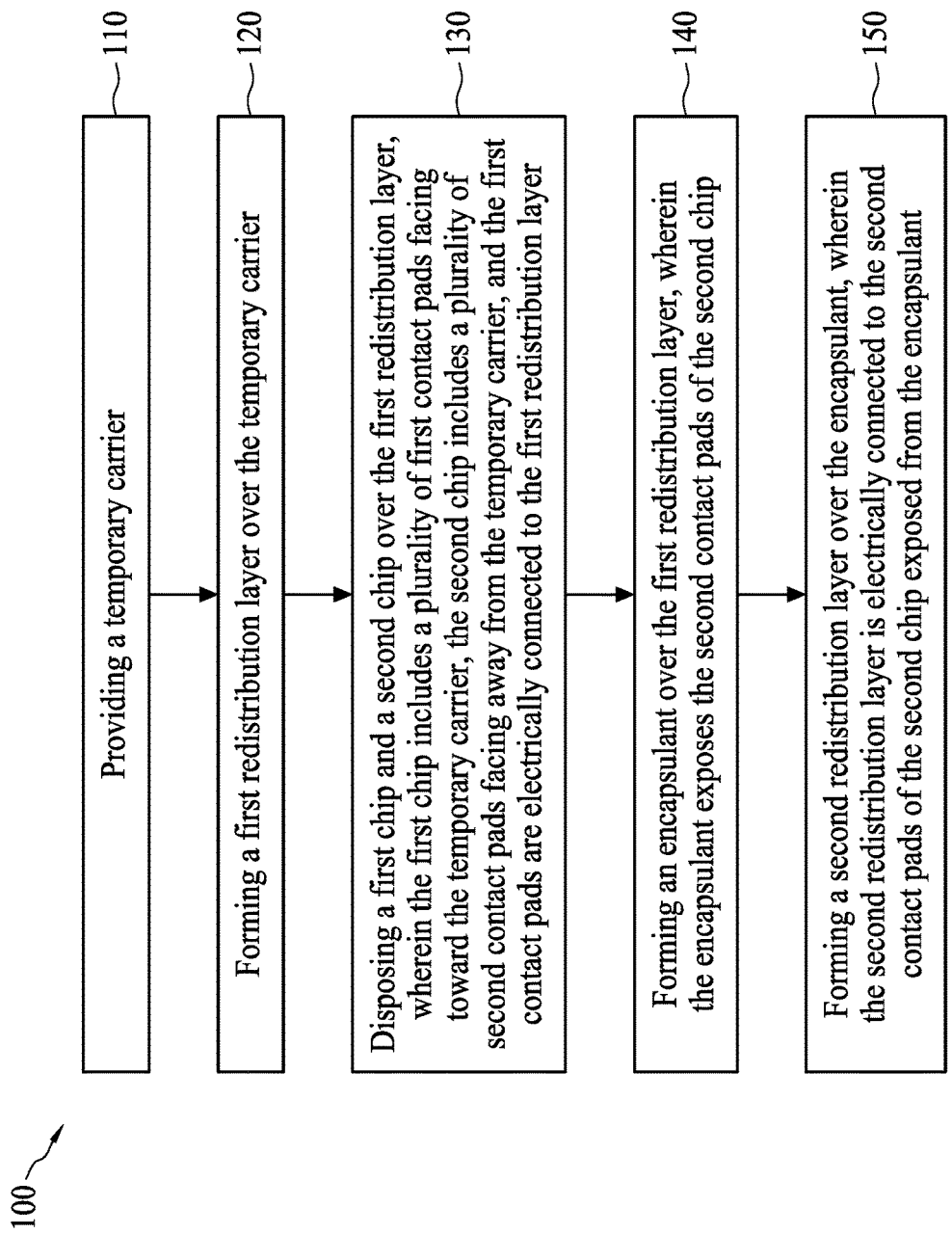
FIG. 1 is a flow chart illustrating a method for manufacturing a semiconductor package structure according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the term "temporary carrier" refers to a carrier configured as an intermediate substrate for facility of fabrication of overlying layer or component such as redistribution layer, chip, encapsulant, connector and other structures. The temporary carrier provides temporary supporting and fixing functions, and will be removed from the semiconductor package structure.

As used herein, the term "passive device" refers to devices including resistors, capacitors, inductors or a combination thereof.

As used herein, the term "redistribution layer" refers to a layer stack formed from at least one conductive pattern and at least one insulation layer, and configured to communicate with two or more devices electrically thereto.

FIG. 1 is a flow chart illustrating a method for manufacturing a semiconductor package structure according to various aspects of the present disclosure. The method 100 begins with operation 110 in which a temporary carrier is provided. The method 100 continues with operation 120 in which a first redistribution layer is formed over the temporary carrier. The method 100 proceeds with operation 130 in which a first chip and a second chip are disposed over the first redistribution layer. The first chip includes a plurality of contact pads facing toward the temporary carrier, and the second chip includes a plurality of contact pads facing away from the temporary carrier. The contact pads are electrically connected to the first redistribution layer. The method 100 proceeds with operation 140 in which an encapsulant is formed over the first redistribution layer. The encapsulant exposes the contact pads of the second chip. The method 100 continues with operation 150 in which a second redistribution layer is formed over the encapsulant. The second redistribution layer is electrically connected to the contact pads of the second chip exposed from the encapsulant.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
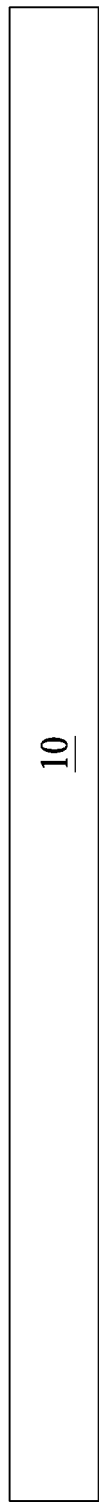
FIGS. 2A, 2B, 2C, 2D, 2E, 2F, 2G, 2H, 2I, 2J and 2K are cross-sectional views at one of various operations of manufacturing a semiconductor package structure according to one or more embodiments of the present disclosure.

FIGS. 2A, 2B, 2C, 2D, 2E, 2F, 2G, 2H, 2I, 2J and 2K are cross-sectional views at one of various operations of manufacturing a semiconductor package structure according to one or more embodiments of the present disclosure. As depicted in FIG. 2A and operation 110 in FIG. 1, a temporary carrier 10 is provided. In one or more embodiments, the temporary carrier 10 is a glass carrier, but not limited thereto. The material of the temporary carrier 10 may be other suitable materials.

Figure 2B:
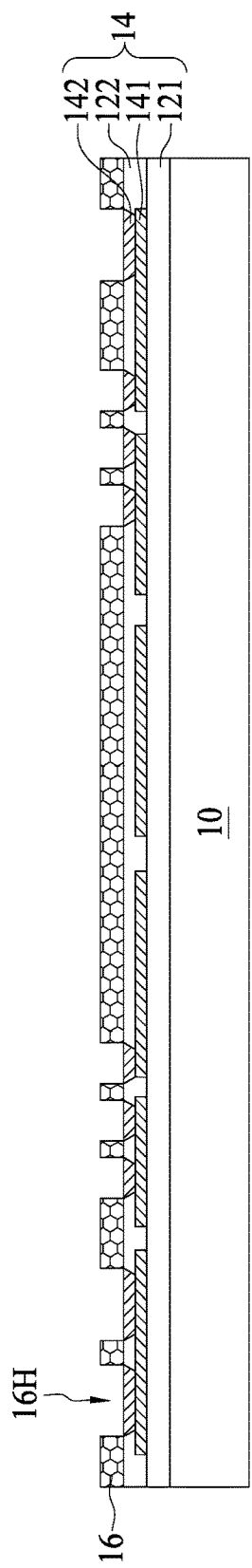
Figure 2C:
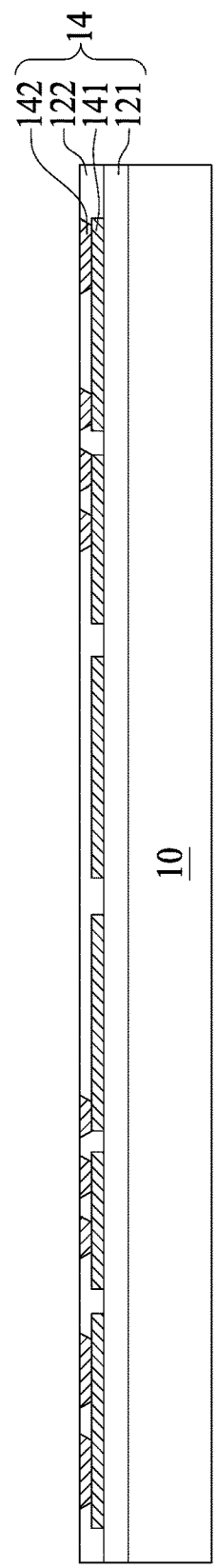

As depicted FIGS. 2B-2C and operation 120 in FIG. 1, a first redistribution layer (RDL) 14 is formed over the temporary carrier 10. FIGS. 2B and 2C illustrate an example of forming the first redistribution layer 14 in accordance with one or more embodiments. As depicted in FIG. 2B, a first insulation layer 121 is formed over the temporary carrier 10. In one or more embodiments, the first insulation layer 121 is an organic insulation layer such as a polymer layer, but not limited thereto. The first insulation layer 121 may be coated over the temporary carrier 10 by, e.g., spinning coating, and may be cured if necessary. Subsequently, a first conductive pattern 141 is formed over the first insulation layer 121. In one or more embodiments, the material of the first conductive pattern 141 is metal such as copper, titanium, the like, or a combination thereof, and the first conductive pattern 141 may be patterned by etching or the like.

Then, a second insulation layer 122 is formed over the first insulation layer 121 and the first conductive layer 141. The second insulation layer 122 is patterned to expose several portions of the first conductive layer 141. In one or more embodiments, the second insulation layer 122 is an organic insulation layer such as a polymer layer, but not limited thereto. In one or more embodiments, the second insulation layer 122 is photosensitive, which can be patterned by exposure and development. In such a case, no etching is required to pattern the second insulation layer 122.

A masking pattern 16 such as a photoresist pattern is then formed over the second insulation layer 122. The masking pattern 16 includes a plurality openings 16H corresponding to the first conductive layer 141 exposed by the second insulation layer 122. In one or more embodiments, a seed layer (not shown) may be optionally formed over the second insulation layer 122 and the exposed first conductive layer 141 prior to the masking pattern 16 is formed.

A second conductive pattern 142 is subsequently formed on the first conductive pattern 141 and electrically connected to the first conductive pattern 141 exposed by the masking pattern 16 and the second insulation layer 122. In one or more embodiments, the material of the second conductive pattern 142 is copper or the like, and the second conductive pattern 142 is formed by plating. The first insulation layer 121, the first conductive pattern 141, the second insulation layer 122 and the second conductive pattern 142 form a first redistribution layer 14. In some other embodiments, the first redistribution layer 14 may include fewer or more insulation layers and conductive patterns stacked to one another. As depicted in FIG. 2C, the masking pattern 16 is removed by, for instance, stripping.

Figure 2D:
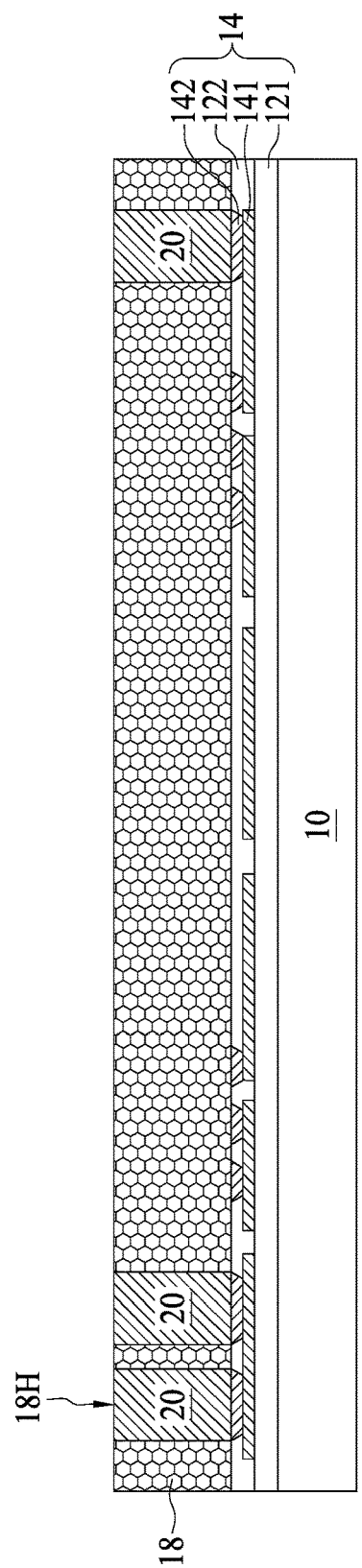
Figure 2E:
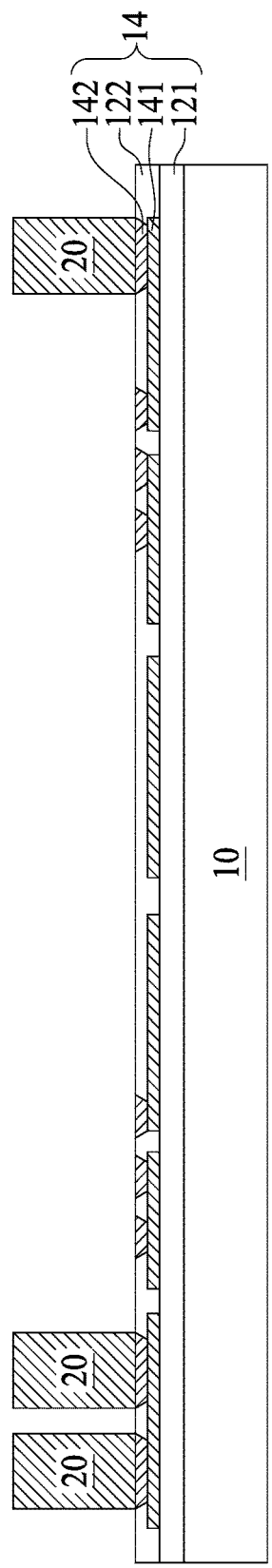

As depicted in FIG. 2D, a resist layer 18 such as a dry film photoresist layer is formed on the first redistribution layer 14. The resist layer 18 includes several openings 18H exposing several portions of the second conductive pattern 142. Then, a plurality of interconnectors 20 are formed on the second conductive pattern 142 exposed from the openings 18H of the resist layer 18. In one or more embodiments, the material of the interconnectors 20 is copper, and the interconnectors 20 are formed by plating. In one or more embodiments, a seed layer (not shown) may be optionally formed over the first redistribution layer 14 prior to the resist layer 18 is formed. As depicted in FIG. 2E, the resist layer 18 is then removed.

Figure 2F:
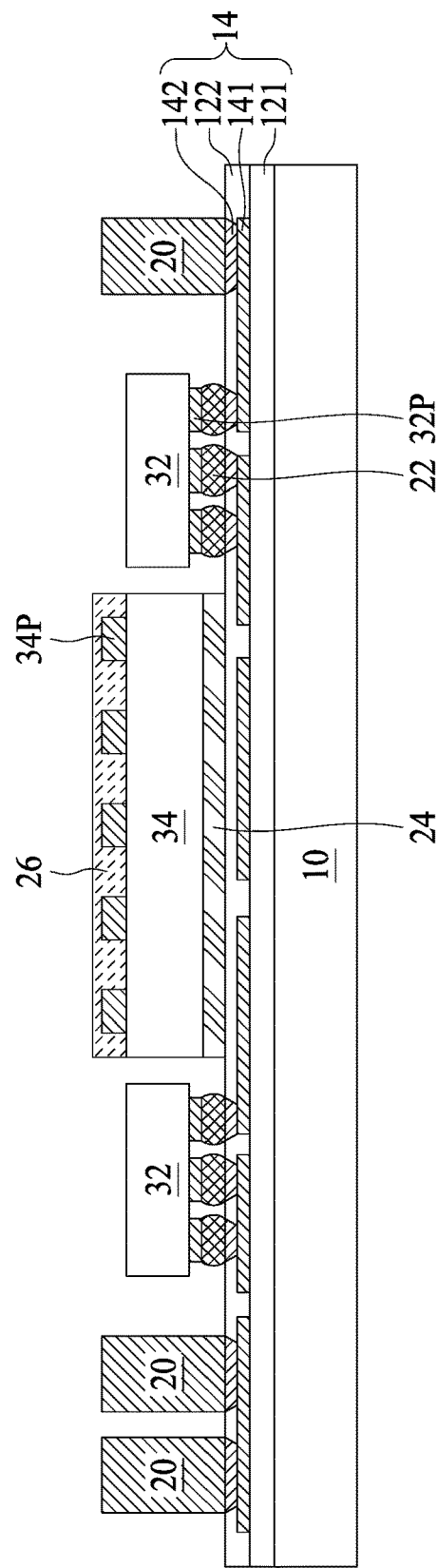

As depicted in FIG. 2F, a first chip 32 and a second chip 34 are disposed over the first redistribution layer 14. The first chip 32 includes a plurality of contact pads 32P facing toward the temporary carrier 10, and the contact pads 32P of the first chip 32 are electrically connected to the first redistribution layer 14. In one or more embodiments, the contact pads 32P of the first chip 32 and the first redistribution layer 14 are electrically connected to each other through a conductive material 22 such as solder paste, solder bump or other suitable conductive materials. In one or more embodiments, the first chip 32 is a passive device chip, which includes passive devices such as resistors, capacitors, inductors or a combination thereof formed therein. The passive devices may be in the form of integrated circuit, but not limited thereto. The second chip 34 includes a plurality of contact pads 34P facing away from the temporary carrier 10. The second chip 34 may be bonded to the second insulation layer 122 of the first redistribution layer 14 with an adhesive layer 24. In one or more embodiments, the second chip 34 is an active device chip, which includes active devices such as bipolar and field effect transistors formed therein. For example, the second chip 34 is a system on chip (SOC). In one or embodiments, the contact pads 34P of the second chip 34 are covered with a protection layer 26 such as a polybenzoxazole (PBO) layer.

Figure 2G:
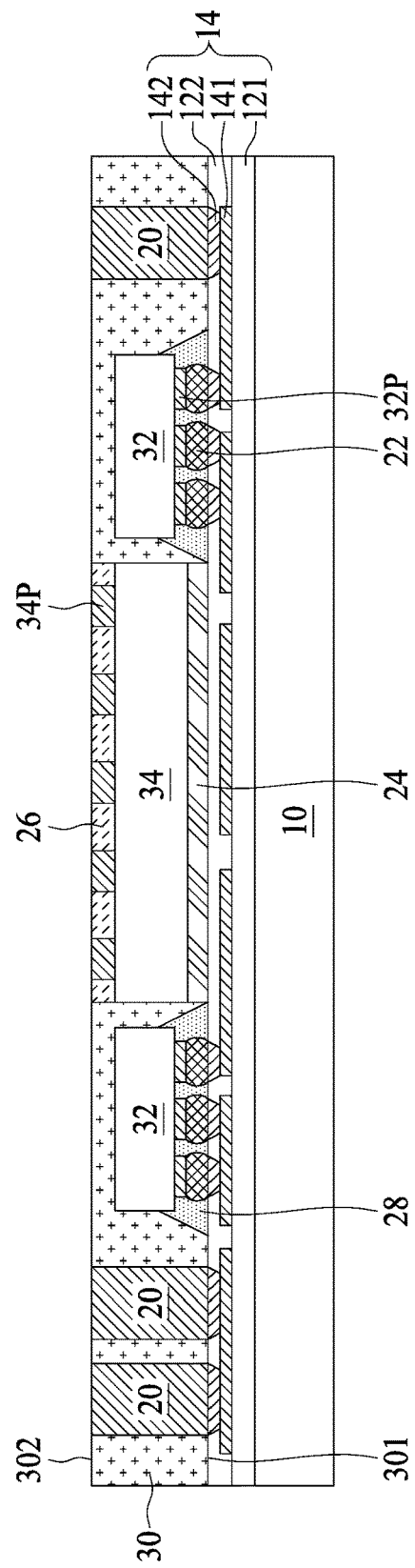

As depicted in FIG. 2G, an underfill layer 28 is formed between the first chip 32 and the first redistribution layer 14. The underfill layer 28 may be curable. Subsequently, an encapsulant 30 is formed over the temporary carrier 10, surrounding the first chip 32, the second chip 34 and the interconnectors 20. The encapsulant 30 includes a first surface 301 facing the temporary carrier 10 and a second surface 302 facing away from the temporary carrier 10. The contact pads 32P of the first chip 32 and one end of each of the interconnectors 20 are exposed from the surface 301 of the encapsulant 30. The encapsulant 30 is then thinned, for example, by grinding from the second surface 302 to expose the other end of each of the interconnectors 20 and the contact pads 34P of the second chip 34. Since the first chip 32 and the second chip 34 are disposed in opposite directions, i.e., the contact pads 32P face toward the temporary substrate 10 and the contact pads 34P face away from the temporary substrate 10, the thicknesses of the first chip 32 and the second chip 34 are not necessary to be identical, which increases the flexibility in selecting the first chip 32 and the second chip 34. In one or more embodiments, the encapsulant 30 surrounds the lateral surface and the upper surface of the first chip 32 and the lateral surface of the second chip 34, but exposes the upper surface of the second chip 34 after thinning.

Figure 2H:
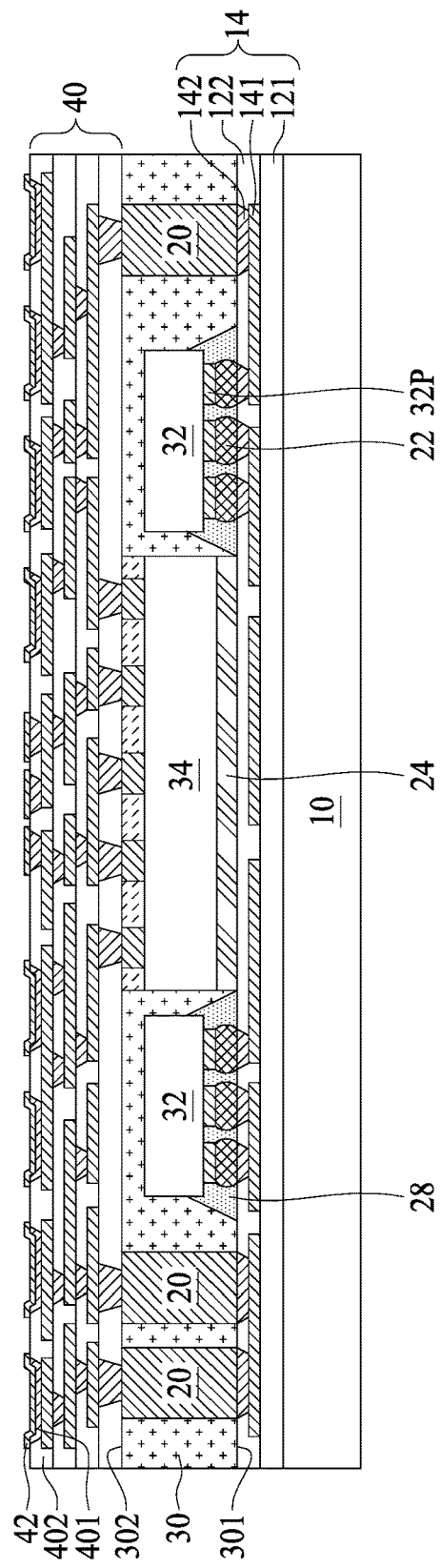

As depicted in FIG. 2H, a second redistribution layer 40 is formed over the second surface 302 of the encapsulant 30. In one or more embodiments, the second redistribution layer 40 includes a plurality of insulation layers and conductive patterns stacked to one another, and some portions of an upmost conductive pattern 401 are exposed from an upmost insulation layer 402. The formation of the second redistribution layer 40 is similar to that of the first redistribution layer 14, which is not redundantly described. In one or more embodiments, an under bump metallurgy (UBM) 42 is formed over the upmost conductive pattern 401 exposed from the upmost insulation layer 402.

Figure 2I:
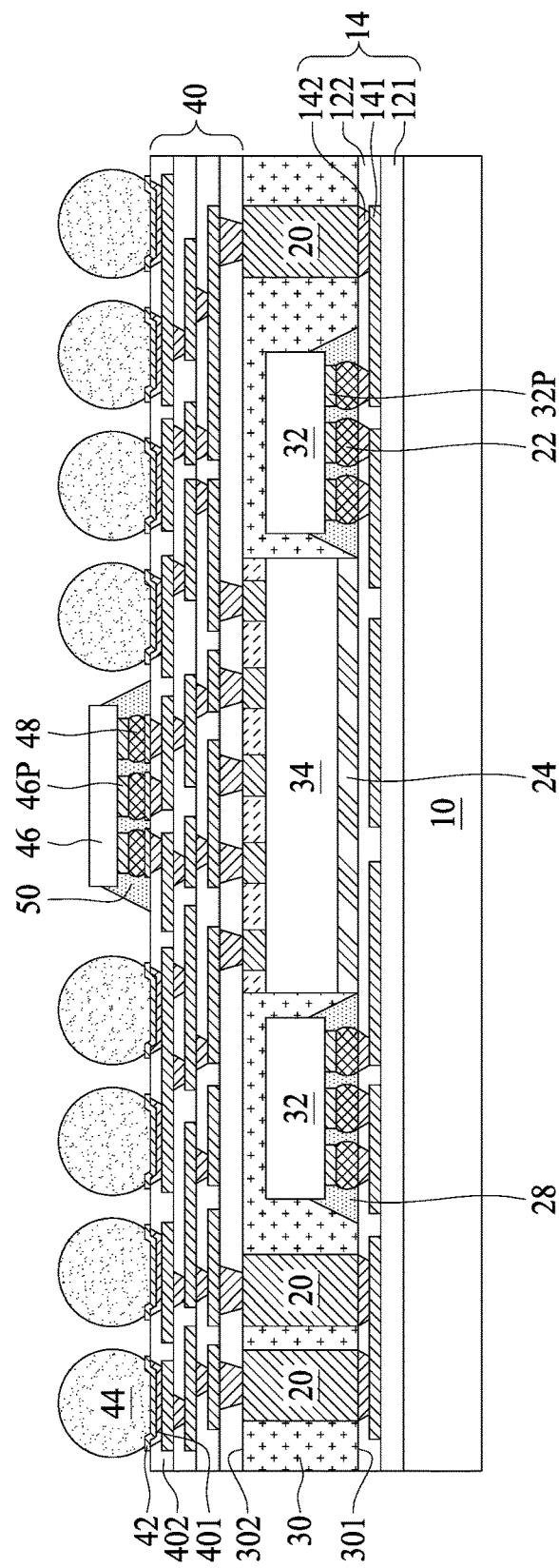

As depicted in FIG. 2I, a plurality of first external connectors 44 are formed over the second redistribution layer 40. In one or more embodiments, the first external connectors 44 are formed on the UBMs 42. The first external connectors 44 may be solder balls, solder bumps or other conductive structures. In one or more embodiments, a third chip 46 may be disposed over and electrically connected to the second redistribution layer 40. By way of an example, the third chip 46 is a second passive device chip, but not limited thereto. The passive device chip may include passive devices such as resistors, capacitors, inductors or a combination thereof formed therein. The passive devices may be in the form of integrated circuit, but not limited thereto. The third chip 46 includes a plurality of contact pads 46P facing toward the temporary carrier 10, and electrically connected to the second redistribution layer 40 with conductive material 48 such as solder paste, solder bump or other suitable conductive materials. An underfill layer 50 is formed between the third chip 46 and the second redistribution layer 40, and the underfill layer 50 may be cured.

Figure 2J:
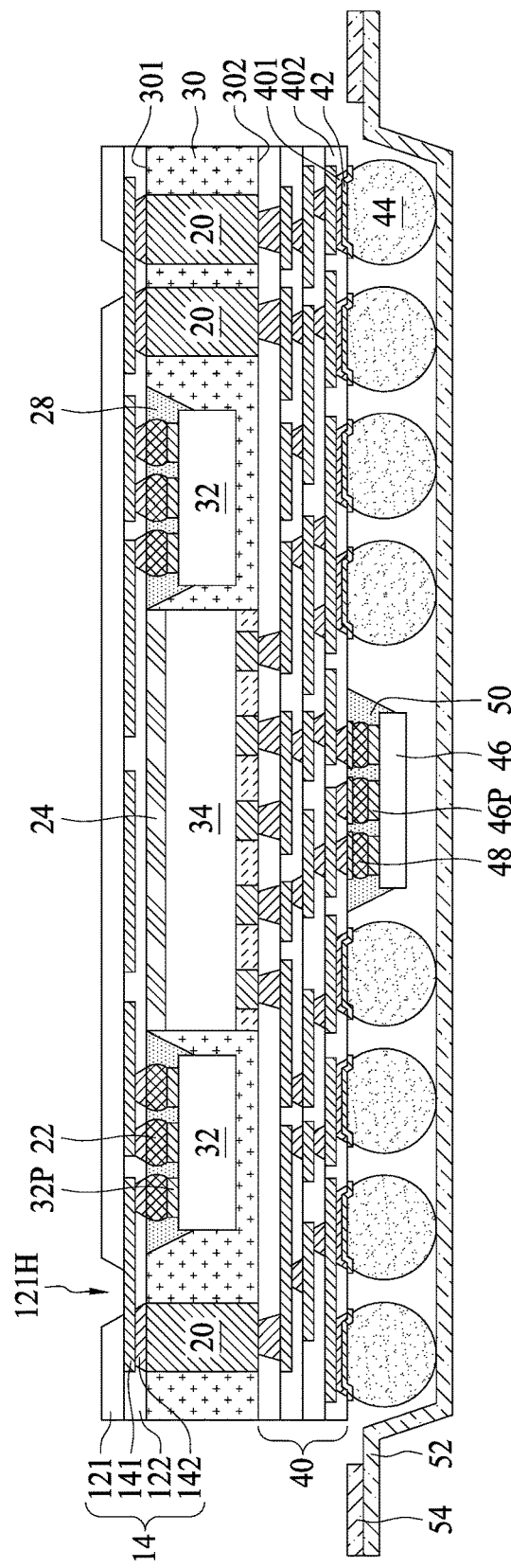

As depicted in FIG. 2J, the first external connectors 44 are electrically connected to a circuit board 52. In one or more embodiments, the circuit board 52 is a tape adhered to a frame 54. The tape may have conductive wirings formed therein, and may be bonded to the first external connectors 44 by tape automated bonding (TAB). Subsequently, the temporary carrier 10 is removed from the first distribution layer 14 to expose the first insulation layer 121. Then, the first insulation layer 121 is patterned by, for example laser drilling to form a number of openings 121H exposing a portion of the first conductive pattern 141.

Figure 2K:
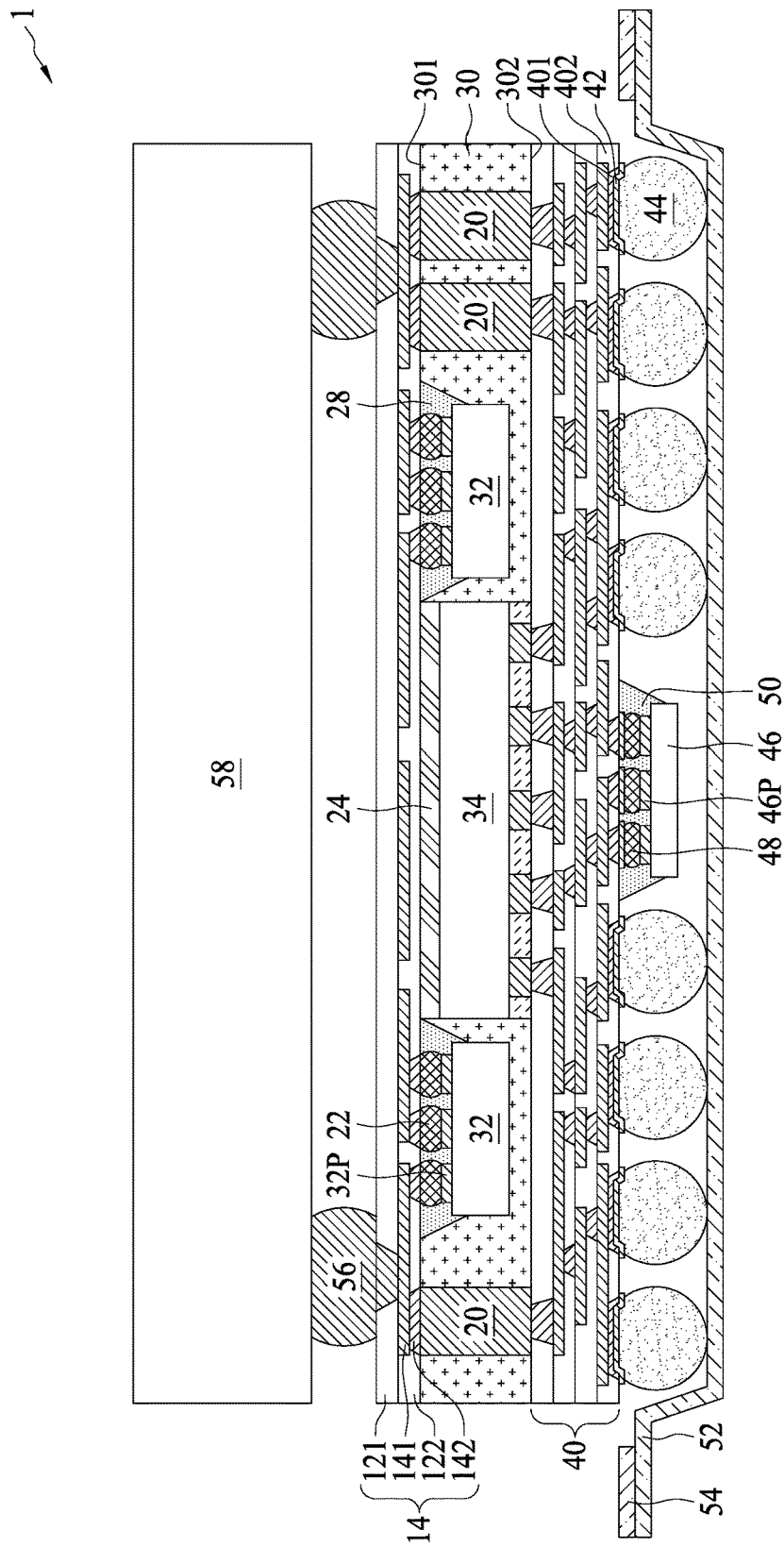

As depicted in FIG. 2K, a number of second external connectors 56 are formed over the first redistribution layer 14. In one or more embodiments, the second external connectors 56 are formed on some portions of the first conductive pattern 141 exposed by the first insulation layer 121. The second external connectors 56 are electrically connected to the interconnectors 20 through the first redistribution layer 14, and thus the second external connectors 56 can be misaligned with the interconnectors 20. Accordingly, the location and size of the second external connectors 56 can be optimized without being limited by that of the interconnectors 20. A package 58 is disposed over the second external connectors 56, and thus the package 58 is electrically connected to the first redistribution layer 14 through the second external connectors 56. In one or more embodiments, the package 58 is a memory package such as a DRAM package, and communication among the first chip 32, the second chip 34, the third chip 46 and the circuit board 52 are carried out through the first redistribution layer 14, the second redistribution layer 40, the first external connectors 44 and the second external connectors 56.

FIG. 2K illustrates a semiconductor package structure 1 in accordance with one or more embodiments of the present disclosure. As illustrated in FIG. 2K, the first chip 32 is embedded in the encapsulant 30. Accordingly, there is more space to accommodate more first external connectors 44, and the locations of the first external connector 44 can be arranged more symmetrically to reduce warpage risk. Consequently, the semiconductor package structure 1 is compatible with chips or devices with high I/O counts. In addition, the thickness of the first chip 32 is not limited by the size of the first external connector 44. For example, the thickness of the first chip 32 may be sufficiently large to reduce handling concerns during delivering or mounting operations. The first chip 32 and the second chip 34 are disposed in opposite directions, and thus the thicknesses of the first chip 32 and the second chip 34 are not necessary to be identical, which increases the flexibility in selecting the first chip 32 and the second chip 34. The contact pads 32P of the first chip 32 face toward the package 58, and thus the first chip 32 can communicate with the package 58 through the first distribution layer 14, which can improve signal integrity, power stability and noise filtering therebetween. Similarly, the contact pads 34P of the second chip 34 face the contact pads 46P of the third chip 46, and thus the second chip 34 can communicate with the circuit board 52 through the second redistribution layer 40, which can improve signal integrity, power stability and noise filtering therebetween. The first distribution layer 14 is able to relocate and enlarge the contact locations for the second external connectors 56, which makes it possible to optimize the location and size of the interconnectors 20 in circuit design. Consequently, the overall circuit performance can be optimized.

The present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3A:
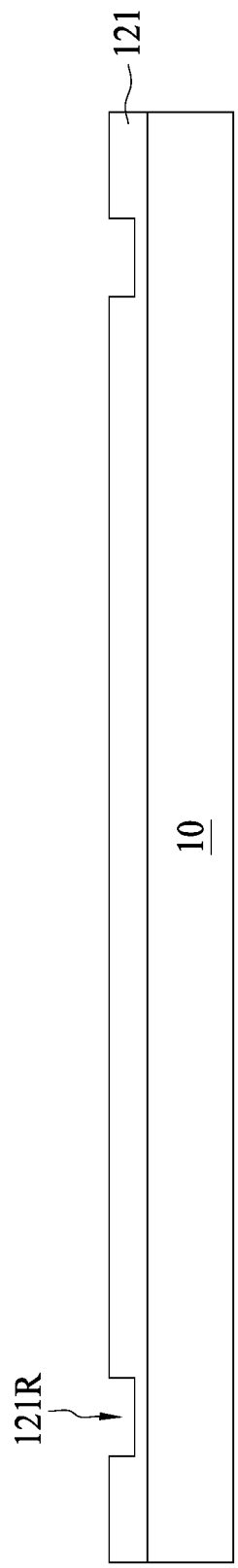
FIGS. 3A, 3B, 3C and 3D are cross-sectional views at some of various operations of manufacturing a semiconductor package structure according to one or more embodiments of the present disclosure.

FIGS. 3A, 3B, 3C and 3D are cross-sectional views at some of various operations of manufacturing a semiconductor package structure according to one or more embodiments of the present disclosure. As depicted in FIG. 3A, the first insulation layer 121 is formed over the temporary carrier 10. The first insulation layer 121 is patterned to form a plurality of recesses 121R prior to the first conductive pattern 141. In one or more embodiments, the recess 121R does not through the first insulation layer 121, but not limited thereto. In one or more embodiments, the first insulation layer 121 is photosensitive, and patterned by exposure and development.

Figure 3B:
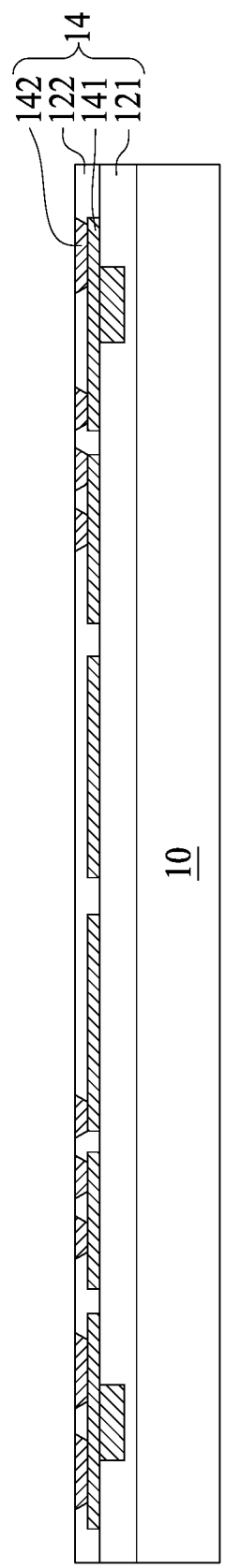

As depicted in FIG. 3B, the first conductive pattern 141 is formed over the first insulation layer 121 and inside the recesses 121R of the first insulation layer 121. Subsequently, the second insulation layer 122 is formed over the first insulation layer 121 and the first conductive layer 141. Following that, the second conductive pattern 142 is formed on the first conductive pattern 141 and electrically connected to the first conductive pattern 141. Accordingly, the first insulation layer 121, the first conductive pattern 141, the second insulation layer 122 and the second conductive pattern 142 form the first redistribution layer 14. Subsequent operations similar to that disclosed in the aforementioned embodiment as illustrated in FIGS. 2C, 2D, 2E, 2F, 2G, 2H and 2I are performed.

Figure 3C:
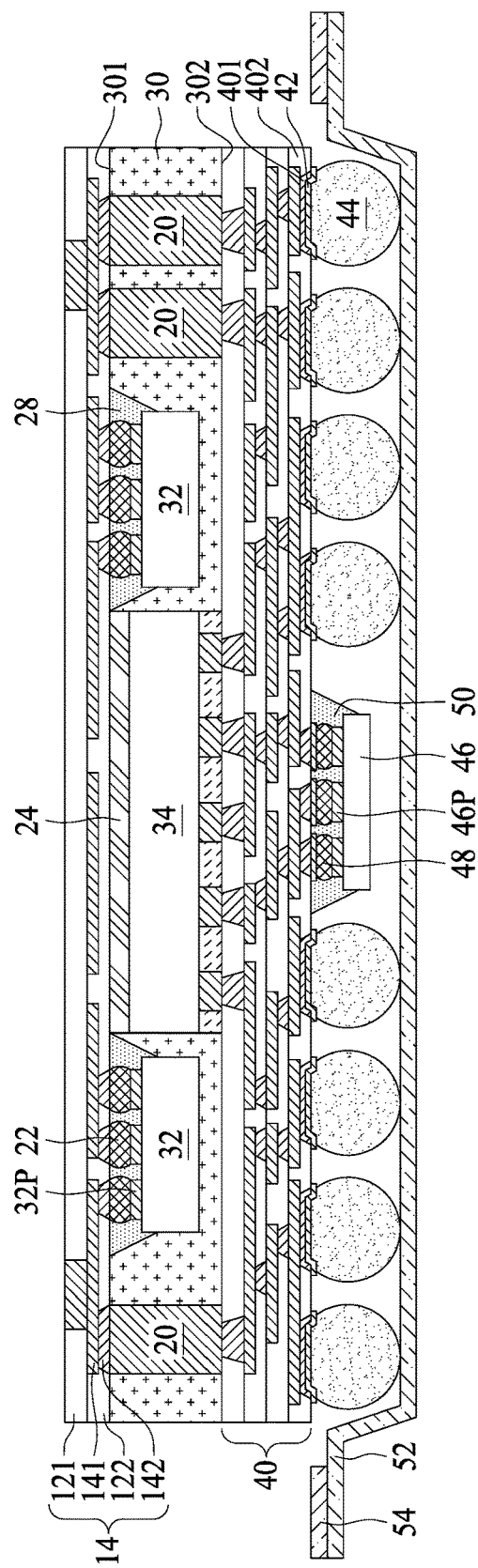

As depicted in FIG. 3C, the temporary carrier 10 is removed from the first distribution layer 14 to expose the first insulation layer 121. After the temporary carrier 10 is removed, the first insulation layer 121 is thinned until the recesses 121R penetrate through the first insulation layer 121 such that the first conductive pattern 141 is exposed. The first conductive pattern 141 in the recesses 121R is configured as bonding pads for the package. Since the first conductive pattern 141 is formed inside the recesses 121R in previous operation, the first conductive pattern 141 can be exposed by thinning without requiring a masking layer or resist layer. In one or more embodiments, the thinning of the first insulation layer 121 is carried out by etching such as dry etching without requiring a masking layer or resist layer. Accordingly, the locations of the bonding pads can be accurately controlled, and the manufacturing cost is reduced.

Figure 3D:
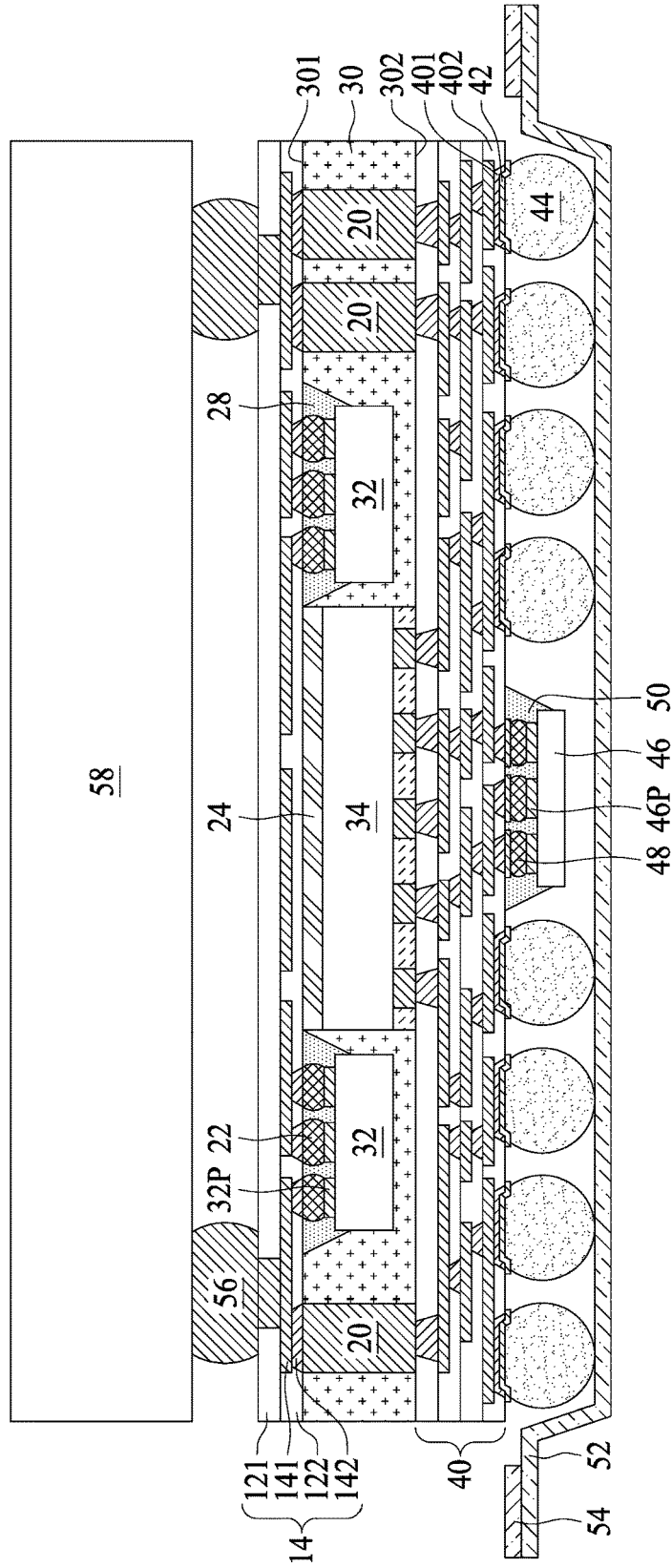

As depicted in FIG. 3D, a plurality of second external connectors 56 are formed over the first redistribution layer 14. In one or more embodiments, the second external connectors 56 are formed on some portions of the first conductive pattern 141 exposed by the first insulation layer 121. A package 58 is disposed over the first external connectors 56, and thus the package 58 is electrically connected to the first redistribution layer 14 through the second external connectors 56. In one or more embodiments, the package 58 is a memory package such as a DRAM package, and communication among the first chip 32, the second chip 34, the third chip 46 and the circuit board 52 are carried out through the first redistribution layer 14, the second redistribution layer 40, the first external connectors 44 and the second external connectors 56.

FIG. 3D illustrates a semiconductor package structure 2 in accordance with one or more embodiments of the present disclosure. As illustrated in FIG. 3D, the first chip 32 is embedded in the encapsulant 30. Accordingly, there is more space to accommodate more first external connectors 44, and the locations of the first external connector 44 can be arranged more symmetrically to reduce warpage risk. Consequently, the semiconductor package structure 1 is compatible with chips or devices with high I/O counts. In addition, the thickness of the first chip 32 is not limited by the size of the first external connector 44. For example, the thickness of the first chip 32 may be sufficiently large to reduce handling concerns during delivering or mounting operations. The first chip 32 and the second chip 34 are disposed in opposite directions, and thus the thicknesses of the first chip 32 and the second chip 34 are not necessary to be identical, which increases the flexibility in selecting the first chip 32 and the second chip 34. The contact pads 32P of the first chip 32 face toward the package 58, and thus the first chip 32 can communicate with the package 58 through the first distribution layer 14, which can improve signal integrity, power stability and noise filtering therebetween. Similarly, the contact pads 34P of the second chip 34 face the contact pads 46P of the third chip 46, and thus the second chip 34 can communicate with the circuit board 52 through the second redistribution layer 40, which can improve signal integrity, power stability and noise filtering therebetween. The first distribution layer 14 is able to relocate and enlarge the contact locations for the second external connectors 56, which makes it possible to optimize the location and size of the interconnectors 20 in circuit design. Consequently, the overall circuit performance can be optimized. The first conductive pattern 141 is formed inside the recesses 121R in previous operation, and thus the first conductive pattern 141 can be exposed by dry etching without requiring a masking layer or resist layer. Accordingly, the locations of the bonding pads can be accurately controlled, and the manufacturing cost is reduced.

Figure 4:
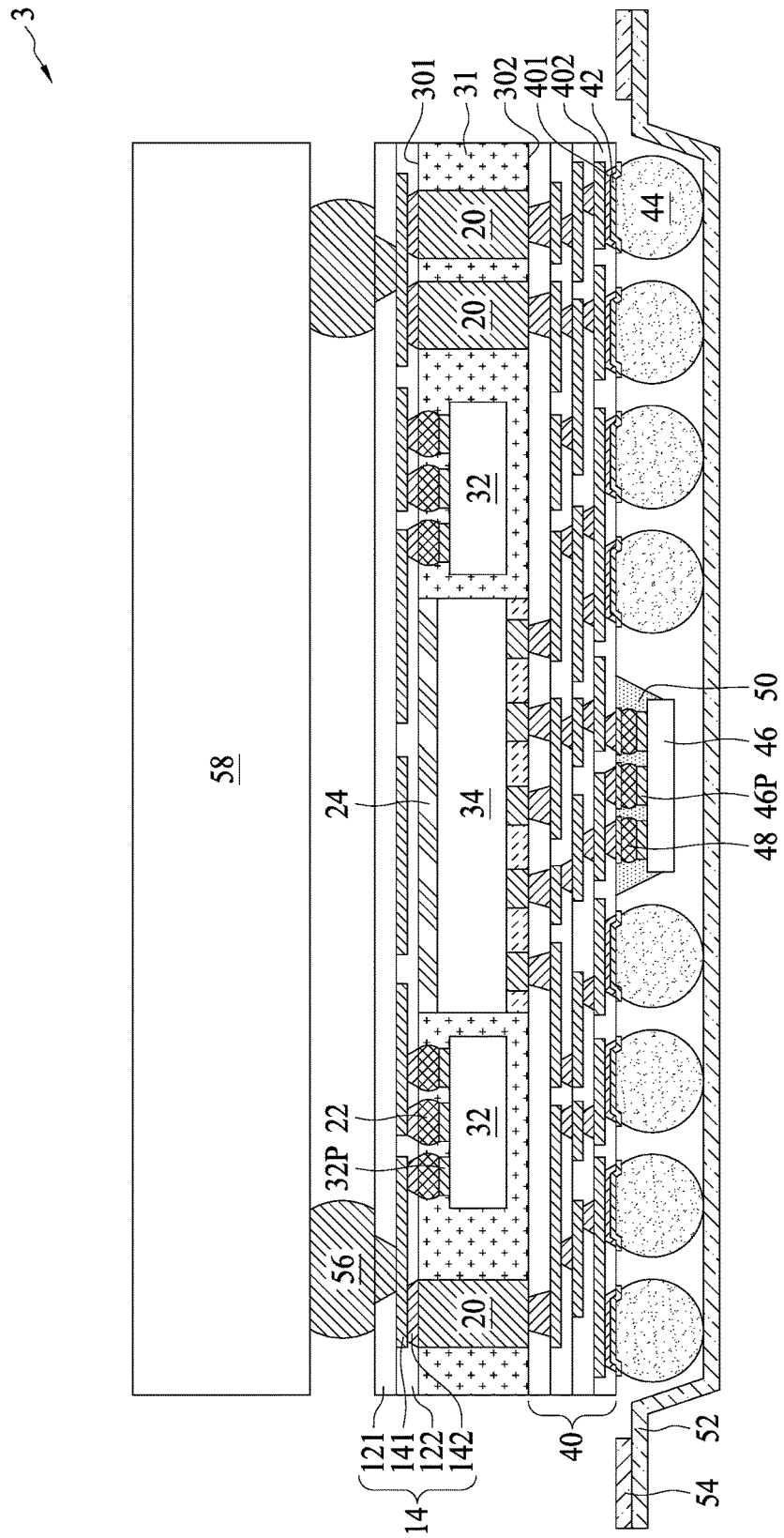
FIG. 4 illustrates a semiconductor package structure in accordance with one or more embodiments of the present disclosure.

FIG. 4 illustrates a semiconductor package structure 3 in accordance with one or more embodiments of the present disclosure. As illustrated in FIG. 4, the underfill layer between the first chip 32 and the first redistribution layer 14 is omitted, and a molding underfill (MUF) layer 31 is applied to incorporate the underfill layer and the encapsulant. Accordingly, the manufacturing cost is reduced.

In the present disclosure, the semiconductor package structure incorporates the passive device chip in the encapsulant so as to provide extra space to accommodate more I/O terminals. The locations of the first external connector can be arranged more symmetrically to reduce warpage risk. The thickness of the first chip is not limited by the size of the first external connector, which reduces handling concerns during delivering or mounting operations. In addition, the first chip and the second chip are disposed in opposite directions, and thus the thicknesses of the first chip and the second chip are not necessary to be identical, which increases the flexibility in selecting the first chip and the second chip. The opposite arrangement of the first chip and the second chip provide an efficient communication between the first chip and the package, and an efficient communication between the second chip and the circuit board. Consequently, signal integrity, power stability and noise filtering of the semiconductor package structure are improved. The first distribution layer is able to relocate and enlarge the contact locations for the second external connectors, which makes it possible to optimize the location and size of the interconnectors in circuit design. Consequently, the overall circuit performance can be optimized.

In one exemplary aspect, a semiconductor package structure includes an encapsulant, a first chip, a second chip, a first redistribution layer and a second redistribution layer. The encapsulant has a first surface and a second surface opposite to each other. The first chip is in the encapsulant, wherein the first chip includes a plurality of contact pads exposed from the first surface of the encapsulant. The second chip is in the encapsulant, wherein second chip includes a plurality of contact pads exposed from the second surface of the encapsulant. The first redistribution layer is over the first surface of the encapsulant and electrically connected to the contact pads of the first chip. The second redistribution layer is over the second surface of the encapsulant and electrically connected to the contact pads of the second chip.

In another exemplary aspect, a semiconductor package structure includes an encapsulant, a passive device chip, an active device chip, a first redistribution layer and a second redistribution layer. The encapsulant has a first surface and a second surface opposite to each other. The passive device chip is in the encapsulant, wherein passive device chip includes a plurality of contact pads. The active device chip is in the encapsulant, wherein active device chip includes a plurality of contact pads. The first redistribution layer is over the first surface of the encapsulant and electrically connected to the contact pads of the passive device chip. The second redistribution layer is over the second surface of the encapsulant and electrically connected to the contact pads of the active device chip.

In yet another aspect, a method of manufacturing a semiconductor package structure includes the following operations. A temporary carrier is provided. A first redistribution layer is formed over the temporary carrier. A first chip and a second chip are disposed over the first redistribution layer, wherein the first chip includes a plurality of contact pads facing toward the temporary carrier, the second chip includes a plurality of contact pads facing away from the temporary carrier, and the contact pads of the first chip are electrically connected to the first redistribution layer. An encapsulant is formed over the first redistribution layer, wherein the encapsulant exposes the contact pads of the second chip. A second redistribution layer is formed over the encapsulant, wherein the second redistribution layer is electrically connected to the contact pads of the second chip exposed from the encapsulant.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
    an encapsulant having a first surface and a second surface opposite to each other;
    a first chip in the encapsulant, wherein the first chip includes a plurality of contact pads exposed from the first surface of the encapsulant;
    a second chip in the encapsulant, wherein the second chip includes a plurality of contact pads exposed from the second surface of the encapsulant;
    a first redistribution layer over the first surface of the encapsulant and electrically connected to the contact pads of the first chip;
    a second redistribution layer over the second surface of the encapsulant and electrically connected to the contact pads of the second chip;
    a plurality of first external connectors over the second redistribution layer on a side opposite from the second chip;
    a third chip over the second redistribution layer;
    a package electrically connected to the first redistribution layer; and
    a plurality of second external connectors over the first redistribution layer on a side opposite from the first chip, wherein the package is spaced apart from the first redistribution layer by the plurality of second external connectors,
    wherein the third chip is disposed between two of the first external connectors.

2. The semiconductor package structure of claim 1, wherein a lateral surface of the first chip and a lateral surface of the second chip are surrounded by the encapsulant.

3. The semiconductor package structure of claim 1, wherein the first chip is a passive device chip, and the second chip is an active device chip.

4. The semiconductor package structure of claim 1, further comprising a plurality of interconnectors in the encapsulant, wherein the interconnectors are exposed from the first surface and the second surface of the encapsulant, and the first redistribution layer and the second redistribution layer are electrically connected to each other through the interconnectors.

5. The semiconductor package structure of claim 1, wherein each of the first redistribution layer and the second redistribution layer comprises a conductive pattern, and an insulation layer exposing a portion of the conductive pattern.

6. The semiconductor package structure of claim 5, further comprising:
    a circuit board, wherein the first external connectors are between the insulation layer of the second redistribution layer and the circuit board, and the conductive pattern of the second redistribution layer is electrically connected to the circuit board through the first external connectors.

7. The semiconductor package structure of claim 5, wherein the package is electrically connected to the interconnectors through the second external connectors and the conductive pattern of the first redistribution layer.

8. The semiconductor package structure of claim 7, wherein the second external connectors are misaligned with the interconnectors.

9. A semiconductor package structure, comprising:
    an encapsulant having a first surface and a second surface opposite to each other;
    a first passive device chip in the encapsulant, wherein the first passive device chip includes a plurality of contact pads;
    an active device chip in the encapsulant, wherein the active device chip includes a plurality of contact pads;
    a first redistribution layer over the first surface of the encapsulant and electrically connected to the contact pads of the passive device chip;
    a second redistribution layer over the second surface of the encapsulant and electrically connected to the contact pads of the active device chip;
    a second passive device chip over the second redistribution layer, wherein the second passive device chip is disposed over one side of the second redistribution layer opposite from the active device chip;
    a plurality of first external connectors disposed over the second redistribution layer; and
    a plurality of second external connectors disposed over the first redistribution layer,
    wherein the plurality of first external connectors and the plurality of second external connectors are disposed over two opposite sides of the encapsulant.

10. The semiconductor package structure of claim 9, wherein the contact pads of the first passive device chip are exposed from the first surface of the encapsulant, and the contact pads of the active device chip are exposed from the second surface of the encapsulant.

11. The semiconductor package structure of claim 9, wherein the second passive device chip includes a plurality of contact pads electrically connected to the second redistribution layer, and the second redistribution layer is disposed between the active device chip and the second passive device chip.

12. The semiconductor package structure of claim 9, wherein each of the first redistribution layer and the second redistribution layer comprises a conductive pattern, and an insulation layer exposing a portion of the conductive pattern.

13. The semiconductor package structure of claim 12, further comprising:
    a circuit board,
    wherein the second redistribution layer is electrically connected to the circuit board through the plurality of first external connectors.

14. The semiconductor package structure of claim 12, further comprising a package, wherein the package is electrically connected to the second external connectors and the first redistribution layer.

15. A semiconductor package structure, comprising:
    an encapsulant having a first surface and a second surface opposite to each other;
    a first chip in the encapsulant, wherein the first chip includes a plurality of contact pads exposed from the first surface of the encapsulant;
    a second chip in the encapsulant, wherein the second chip includes a plurality of contact pads exposed from the second surface of the encapsulant;
    a first redistribution layer over the first surface of the encapsulant and electrically connected to the contact pads of the first chip;
    a second redistribution layer over the second surface of the encapsulant and electrically connected to the contact pads of the second chip;
    a plurality of interconnectors in the encapsulant and electrically connected to the first redistribution layer and the second redistribution layer;
    a plurality of first external connectors over the second redistribution layer on a side opposite from the second chip;
    a third chip over the second redistribution layer; and a plurality of second external connectors over the first redistribution layer on a side opposite from the first chip,
wherein the third chip is disposed between two of the first external connectors.

16. The semiconductor package structure of claim 15, further comprising an underfill layer between the first chip and the first redistribution layer, and an adhesive layer between the second chip and the first redistribution layer.

17. The semiconductor package structure of claim 15, wherein a lateral surface of the first chip and a lateral surface of the second chip are surrounded by the encapsulant.

18. The semiconductor package structure of claim 15, wherein the third chip includes a plurality of contact pads electrically connected to the second redistribution layer, and the second redistribution layer is disposed between the third chip and the second chip.

19. The semiconductor package structure of claim 15, further comprising:
   a circuit board, wherein the first external connectors are between the second redistribution layer and the circuit board, and the second redistribution layer is electrically connected to the circuit board through the first external connectors.

20. The semiconductor package structure of claim 15, further comprising a package, wherein the package is electrically connected to the interconnectors through the second external connectors and the first redistribution layer.

* * * * *